(12) United States Patent
Kostenko et al.

(10) Patent No.: US 8,934,222 B2
(45) Date of Patent: Jan. 13, 2015

(54) SPLIT- AND COLLAPSIBLE-TOP HAT FRAME HEIGHT REDUCTION FEATURES

(75) Inventors: William P. Kostenko, Poughkeepsie, NY (US); Steven C. McIntosh, Kingsion, NY (US); Budy D. Notohardjono, Poughkeepsie, NY (US); John G. Torok, Poughkeepsie, NY (US); Howard P. Welz, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 1406 days.

(21) Appl. No.: 11/862,249

(22) Filed: Sep. 27, 2007

(65) Prior Publication Data
US 2009/0086419 A1    Apr. 2, 2009

(51) Int. Cl.
| | |
|---|---|
| H05K 5/00 | (2006.01) |
| H05K 7/00 | (2006.01) |
| G11B 33/02 | (2006.01) |
| E04G 3/00 | (2006.01) |
| A47B 96/06 | (2006.01) |
| H05K 7/14 | (2006.01) |

(52) U.S. Cl.
CPC .................................. H05K 7/1488 (2013.01)
USPC ............ 361/679.02; 361/679.32; 361/679.33; 361/679.34; 361/679.39; 361/679.57; 361/679.58; 369/75.21; 278/316.5; 74/142

(58) Field of Classification Search
USPC ...................... 361/679.02, 724–727; 29/428; 248/298.1, 274.1, 122.1, 220.31, 248/220.41; 312/223.1, 223.2, 223.3, 312/257.1, 265.1, 265.4; 211/26
See application file for complete search history.

(56) References Cited

U.S. PATENT DOCUMENTS

| | | | | |
|---|---|---|---|---|
| 5,443,312 | A | * | 8/1995 | Schluter .................... 312/334.27 |
| 6,047,750 | A | * | 4/2000 | Jensen ........................ 144/286.1 |
| 7,090,286 | B1 | * | 8/2006 | Foreth et al. .................. 296/173 |
| 2001/0036399 | A1 | * | 11/2001 | Notohardjono et al. ...... 414/800 |

* cited by examiner

*Primary Examiner* — Jerry Wu
(74) *Attorney, Agent, or Firm* — Margaret A. McNamara; Ido Tuchman

(57) ABSTRACT

An enhanced computer assembly and related method is provided that enables easy shipment and installation of such computing systems. In one embodiment a split top hat design is provided that can be removed. The removable split hat comprises a receiving member and an inner member that are secured to the frame in a manner that can be easily removed. In an alternate embodiment, a collapsible top hat is provided which adjusts the height of the assembly from a first to a second position. The collapsible feature has an upper portion that is connected to a plurality of pivoted side members that are capable of collapsing onto themselves.

10 Claims, 5 Drawing Sheets

SPLIT- AND COLLAPSIBLE-TOP HAT FRAME HEIGHT REDUCTION FEATURES

BACKGROUND OF THE INVENTION

Field of the Invention

This invention relates to the packaging of computing systems and more particularly to packaging of computing systems utilizing tall and/or heavy frames.

DESCRIPTION OF BACKGROUND

The industry trend has been to continuously increase the number of electronic components inside computing systems. As the number of components increase, there has been an effort to keep the footprints of these systems at a minimum. Unfortunately, however, in recent years the needs of the newer and more sophisticated environments have forced the fabrication of taller frames and housing footprints which are also much heavier than their predecessors.

The increased height and weight of these newer footprints have added to the already existing challenges in transportation and installation of large computing environments. Tall frames, are difficult to transport via an airplane or even using ground transportation. Once at a customer site, heavy frames may exceed elevator lifting limit and other factors may cause additional challenges. Lack of human resources, inadequate elevators, short ceilings and door frames, can all cause temporary challenges in subsequent installation of these systems.

In many instances, there has been no other option present than to breakdown and reassemble the frame to enable proper transportation and installation of it. An example of this breakdown and reassembly process is shown in the prior art pictorial depiction illustrated by FIG. 1. Although a more detailed discussion of this figure will be presented later, it is not difficult to see that a complete breakdown and reassembly process as depicted in FIG. 1 is costly and time consuming. Furthermore, alongside the added installation time and the expense associated with such a process, a complete breakdown and reassembly process often provides an added potential for installation errors/problems which in turn affects overall service costs, and cause customer satisfaction and warranty issues.

Consequently, it is desirable to implement a method and system that can lower the challenges caused in the shipment and installation of such tall, heavy systems.

SUMMARY OF THE INVENTION

The shortcomings of the prior art are overcome and additional advantages are provided through the provision of an enhanced computer assembly and related method that enables easy shipment and installation of such computing systems. In one embodiment a split top hat design is provided that can be removed. The removable split hat comprises a receiving member and an inner member that are secured to the frame in a manner that can be easily removed. In an alternate embodiment, a collapsible top hat is provided which adjusts the height of the assembly from a first to a second position. The collapsible feature has an upper portion that is connected to a plurality of pivoted side members that are capable of collapsing onto themselves.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 2:
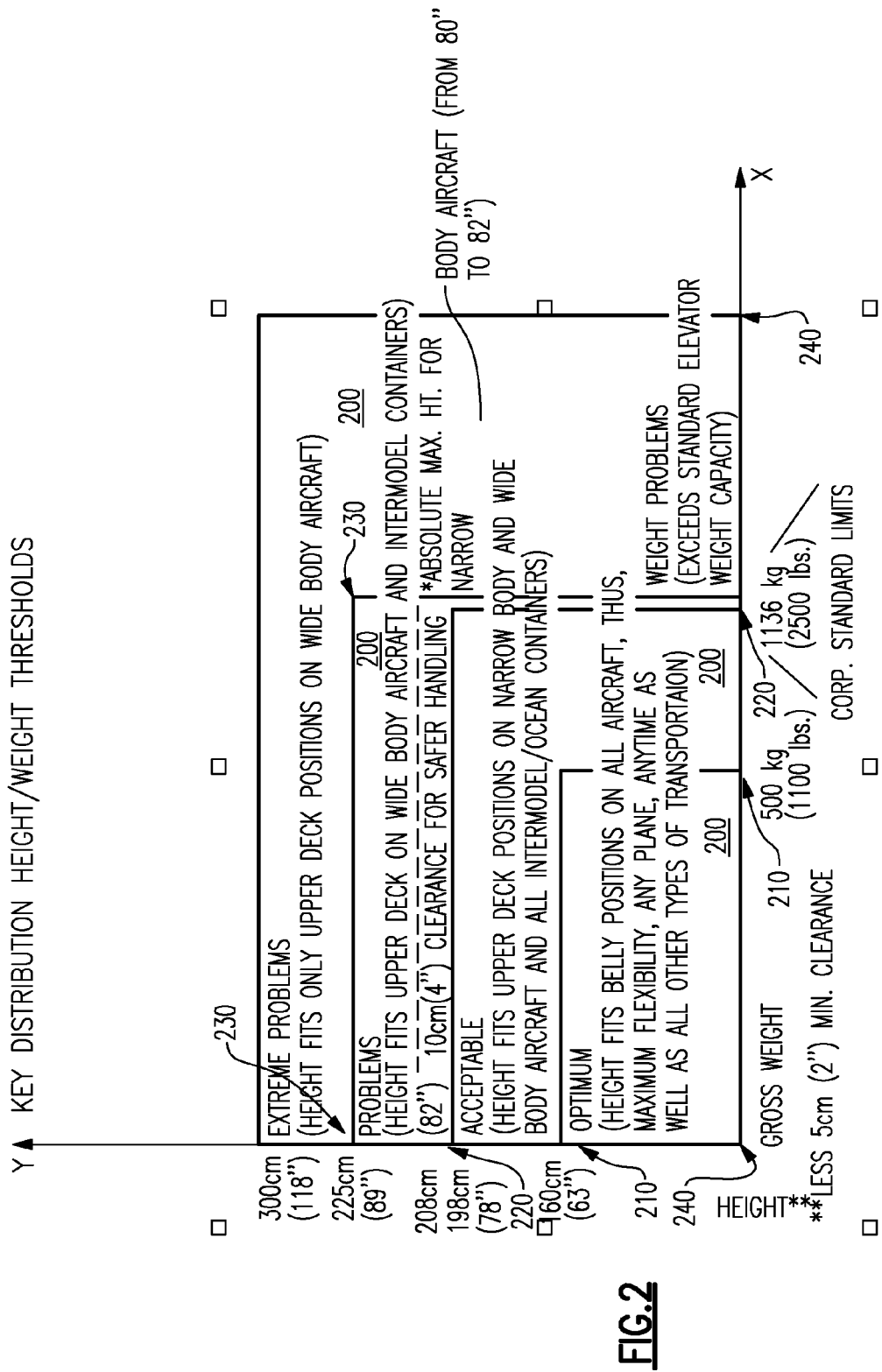
FIG. 2 is a graphical illustration of a frame weight and size thresholds distribution.

FIG. 2 provides an graphical illustration of an exemplary frame 200 and pinpoints particular challenges as the weight and the footprint of the frame 200 is increased. As shown in the illustration of FIG. 2, a graphical distribution of weight and size thresholds of the frame is provided. The vertical y-axis, provides the height of the frame as it grows while the x, or the horizontal axis reflects the weight of the frame.

Referring back to FIG. 2, as illustrated, in instances where frame is under 160 cm or 63 inches, the conditions are optimized for transportation and installation of the frame. For ease of reference, this particular frame footprint is illustrated by reference numerals 210 and even though the frames in general are all referenced by numerals 200, because of its particular footprint, the frame at this footprint will be herein also referenced as frame 210.

In this height frame, the weight of the frame is estimated to be somewhere around 1100 lbs or 500 kg, although there may be some variations due to the components the frame will be housing. At this height and weight, the frame can easily fit the tightest transportation facilities, such as the belly of most aircrafts. Having a size that fits the belly or any aircraft, not only means that any plane at any time can be used, but it also ensures that the frame can easily fit other forms of transportation such as trucks and cargo trains. Furthermore, at this height and weight installation is also simple as the frame can fit standard doors and elevator doors. The weight also allows the frame to be transported up most elevators and be stored at any environment without much difficulty.

As the footprint of the frame increases, the challenges also increase. The new footprint is delineated by heavier lines and referenced by numerals 220. As before, for ease of reference, since the particular frame footprint is referenced as 220, (even though the frame is still represented by numerals 200), because of the particular footprint, the frame at this footprint will be herein also referenced as frame 220.

As illustrated, at this footprint frame 220 has a height of around 78 inches or 198 cm. The weight of the frame, at this height is estimated to be around 2500 lbs or 1136 kg. The absolute height for most narrow bodied aircrafts, are somewhere between 80 to 82 inches, leaving some but very little clearance.

As can be deduced, even at this height, frame 220 is difficult to maneuver. A 2 inch clearance, hardly allows the frame to be moved into and out of the container. This makes tilting and shifting the frame difficult. In addition, if the frame is to be carried on some sort of carrier with wheels to and from the aircraft, the additional height of the wheel may just be sufficient to make the task a challenging one. For a heavy computer most likely the computer is packaged on a pallet and in some instances, the available clearance, for a safer handling will be taken by the height of the pallet. Nonetheless, it is likely that the increased clearance is not available in most such aircrafts thus causing problems. By comparison, the same kind of challenges are also present when using ground transportation or when trying to transport the frame 220 into buildings and up some elevators. In addition, the added weight of the frame makes installation a multi person task and the environment where the frame is being stored needs to also be able to support multiple such frames.

Figure 1:
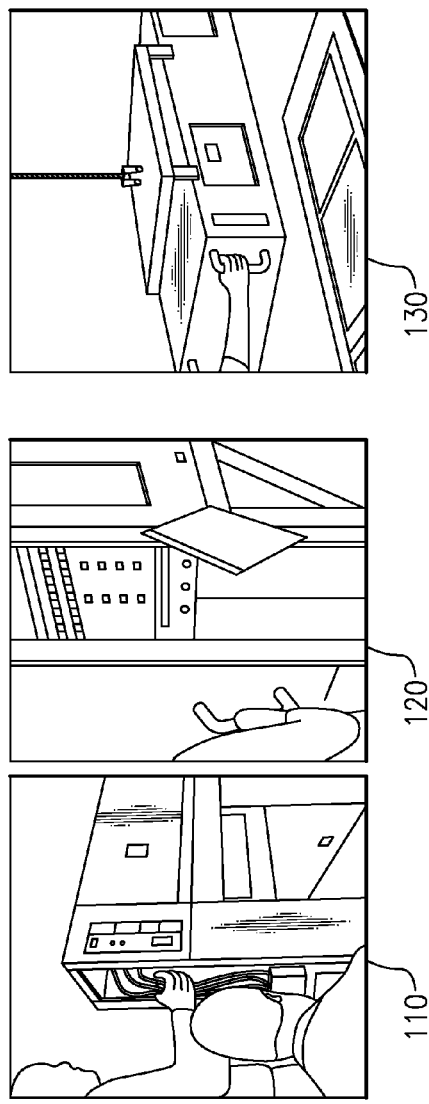
FIG. 1 is a pictorial illustration of a conventional prior art breakdown and reassembly process used for shipping and installation of a tall and/or heavy frame.
Figure 1:
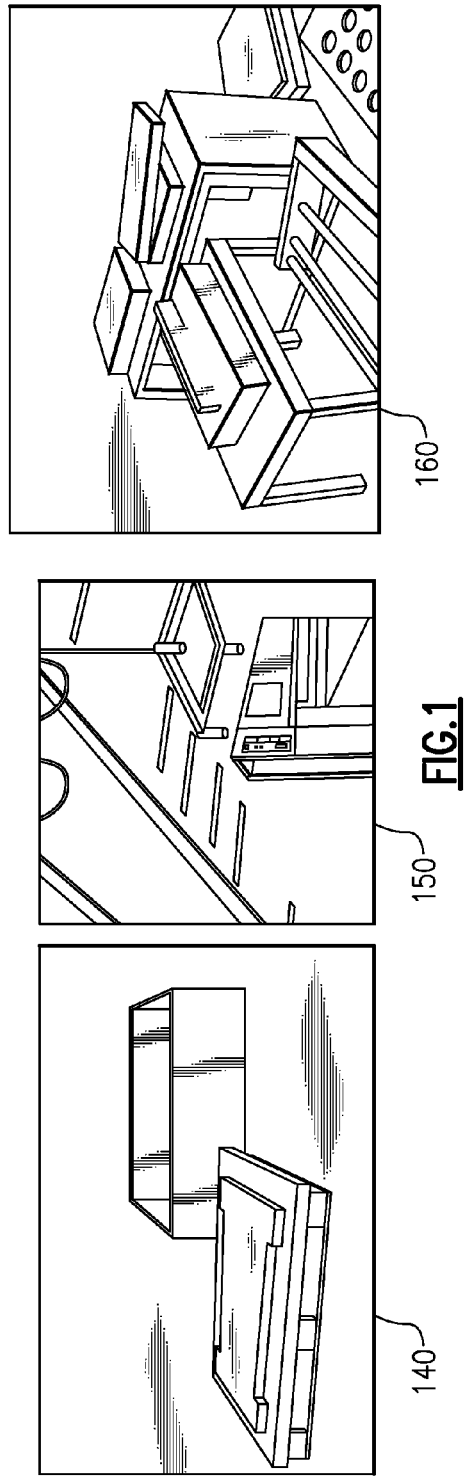

With the next incremental footprint, the challenges increase even more. As illustrated in FIG. 1, the new footprint is delineated by heavier lines and referenced by numerals 230. As before, for ease of reference, since the particular frame footprint is referenced as 230, (even though the frame is still represented by numerals 200), because of the particular footprint, the frame at this footprint will be herein also referenced as frame 230.

Frame 230 has a height of 89 inches or around 208 cms. At this height, the frame (plus the height of the pallet or the container) can only be placed on the upper deck of most wider bodied aircrafts and intermodal containers but narrow bodied aircrafts no longer support this height. This of course narrows the shipping option and takes away from shipping and installation flexibility. Some door frames may also cause a problem when the frame 230 is being transported for final installation. The weight considerations at this weight are similar with that discussed in conjunction with frame 220 and no significant additional challenges are added at this point. However, as was discussed before, the weight is sufficiently heavy to make the installation and servicing of the frame a multi-person task.

When again the footprint of the frame increases, the challenges this time become much more difficult to resolve. The new footprint is delineated by heavier lines and referenced by numerals 240. As before, for ease of reference, since the particular frame footprint is referenced as 240, even though the frame is still represented by numerals 200, because of the particular footprint, the frame at this footprint will be herein also referenced as frame 240.

The new frame 240 now possesses a height of 118 inches or 300 cm. The weight of the frame is now estimated to be far exceeding 2500 lbs. At this height, the frame provides the least amount of flexibility for shipping. Frame 240 only can be shipped by using the upper decks of larger bodied airplanes. Any 8 foot ceiling or door frame, as used in many standard buildings but not warehouses, will also pose a problem. The greatly increased weight also provides a problem with transporting the frame up elevators. The new weight greatly exceeds most regular elevator weight limits. Therefore, at this weight and height, most such frames were broken down and reassembled as discussed before. FIG. 1, provides a pictorial example of such conventional prior art processes.

FIG. 1 is a progression of pictures referenced by numerals 110 through 160. In the first process step, 110, the bolts, cables and other components are first disconnected and shipping bars are then connected as depicted in 120. To reduce the weight and height of the frame, different components are then removed as shown in the depictions of process steps 130 though 150. Process step 160 illustrates the frame as completely disassembled for shipping and installation. Note that after the frame is shipped and arrives at its final destination, the process steps have to be repeated in reverse to reinstall the frame back to its original condition. As discussed earlier, not only this process is time and labor intensive, it adds cost and can lead to potential problems and errors (i.e destruction of parts and software) both at the disassembly and reassembly level.

In order to overcome these and many other such challenges, the workings of the present embodiment provides for a flexible alternative. Some concepts as will be presently disclosed and discussed will focus on reducing frame height to a manageable size to reduce costs and improve overall system shipment-ability and customer satisfaction.

Figure 3:
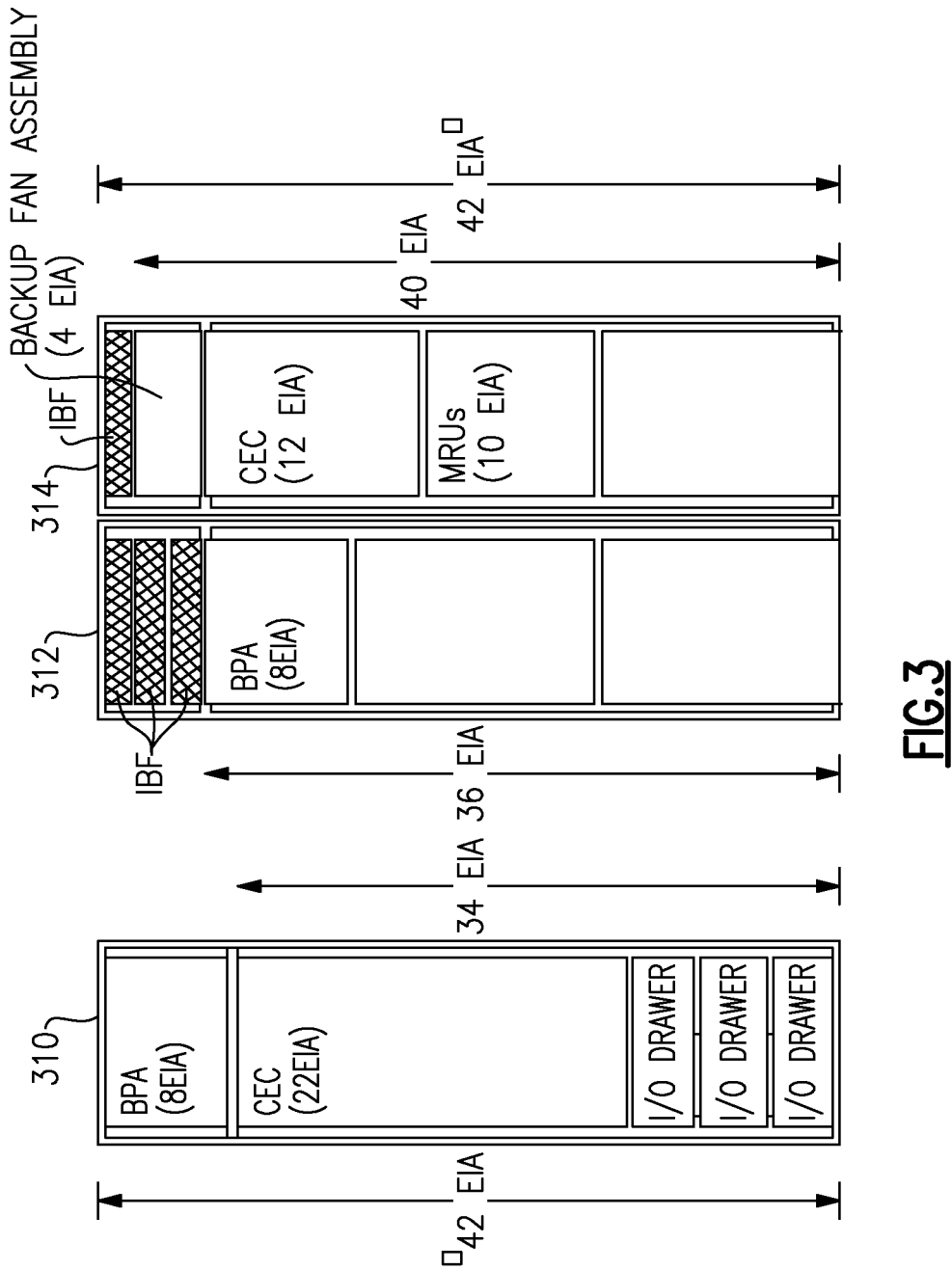
FIG. 3 is an illustration of an exemplary frame and its important components as used by the embodiments of the present invention.

In FIG. 3, three different exemplary base frames are provided as referenced by 310, 312 and 314. Each of these frames are somewhat different to reflect that the workings of the present invention can be applied to a variety of different conditions. Some of these frames as illustrated may include BPA is Bulk Power Assembly, CEC Central Electronic Cage, Cargo is Input Output Assembly (I/O) MRU is Modular Refrigeration Unit. In short some of the base frames represented in FIG. 3 are to provide different frame characteristics, including but not limited to those discussed in FIG. 2. The three frames are chosen to also imply height and weight differences to demonstrate that although the workings of the present invention is designed to aid shipment and installation of tall and/or heavy frames, but it can be applied to those that are lighter and/or shorter when desired.

Figure 4:
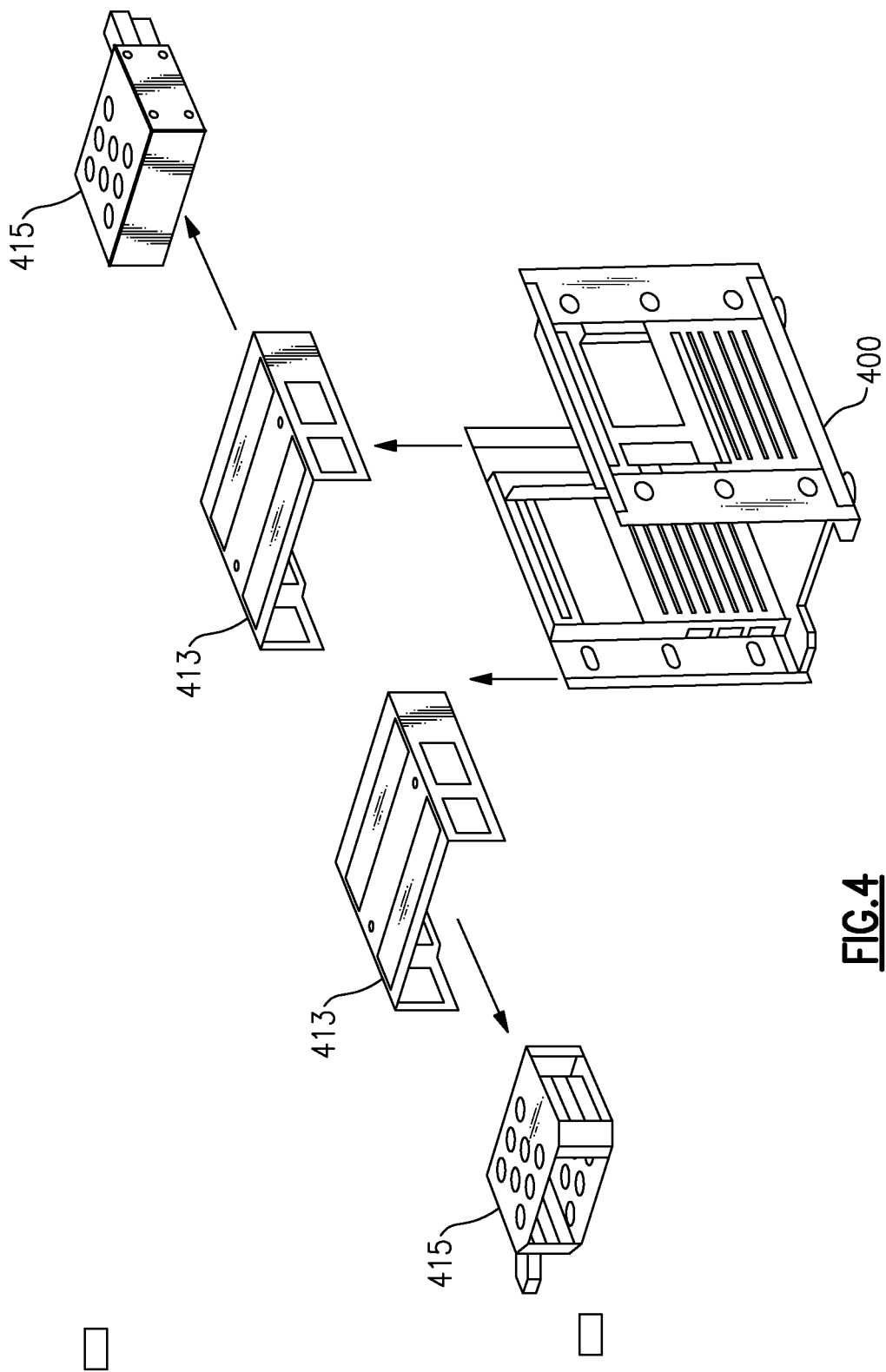
FIG. 4 is an illustration of one embodiment of the present invention using a split top-hat design.
Figure 5:
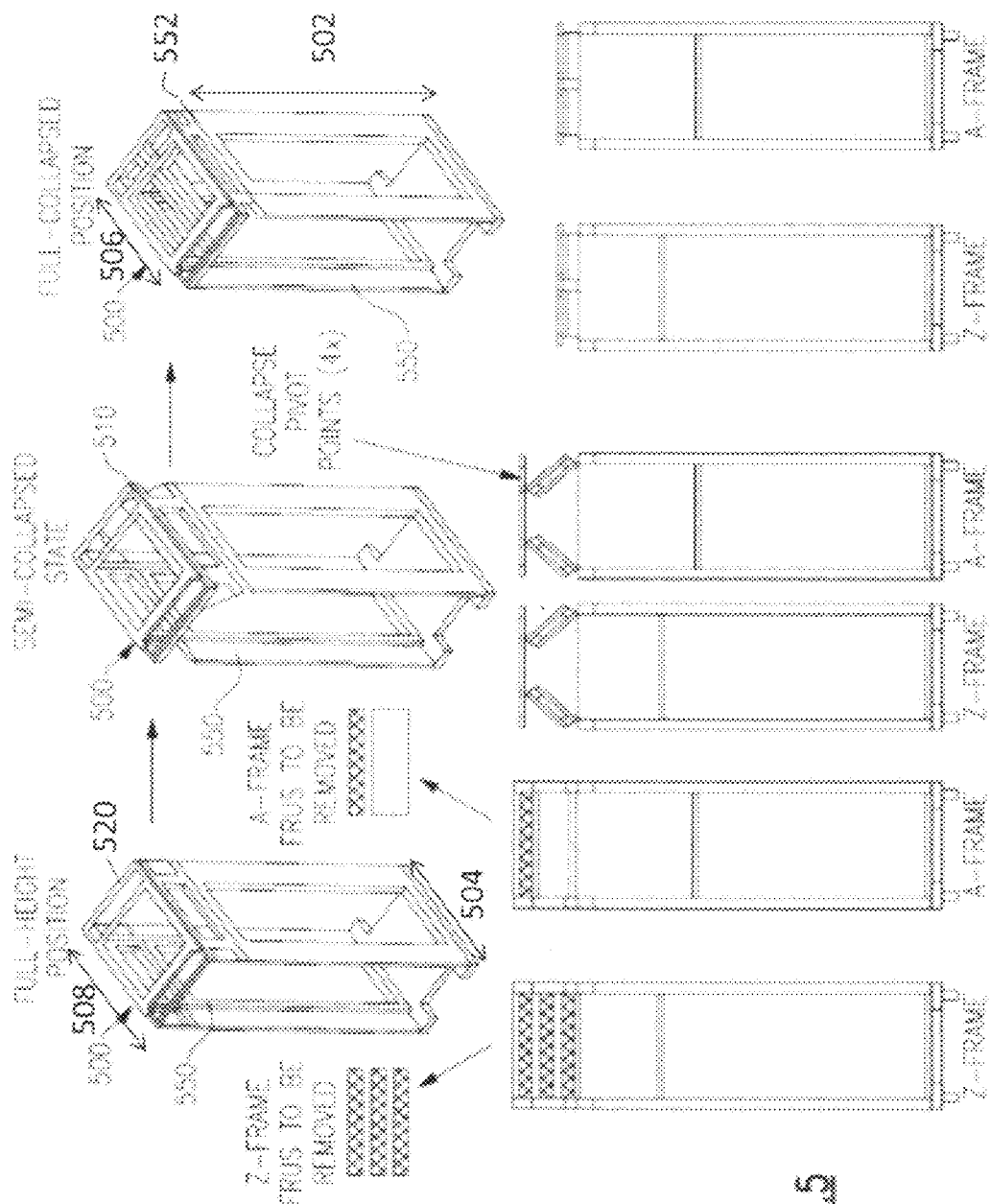
FIG. 5 is an illustration of an alternate embodiment of the present invention using a collapsible top-hat design.

FIGS. 4 and 5 provide two alternate embodiments of the present invention. The embodiment of FIG. 4 provides for a split top hat design and the alternate embodiment of FIG. 5 provides for a collapsible top-hat design.

It should be noted that the embodiments of FIGS. 4 and 5 are only provided as way of example and to ease understanding and other embodiments are equally available under the workings of the present invention. Therefore, the examples provided in these figures shall not be considered to place any limitations on the concepts provided herein by the present invention.

In FIG. 4, a generic base frame 400 which can be representative of a variety of base frames, including but not limited to those discussed in FIGS. 2 and 3 is provided. In other words, the split top hat design can be used with a variety of frame designs such as the examples shown in FIGS. 2 and 3. A two component (split) top hat design will then be assembled on the base frame as shown in the figure. The two split—top hat components of FIG. 4 are shown individually and respectively referenced as 413 and 415. The two portions 413 and 415 are designed to compliment each other and to fit securely. The frame 400 and the two components 413 and 415 are all also designed to fit securely with each other and the frame 400 as desired.

As illustrated, the split top hat includes a receiving member 413 having an upper portion and a plurality of sides. The receiving member 413 then is to receive an inner member 415. In the illustrated embodiment, the receiving member 413 has no bottom so that it is placed over the inner member 415, in a design that encompasses the inner member on three sides. In alternate embodiments, it is possible to have alternate designs where the receiving member has a bottom and the inner member slides into the receiving member. Other such alternate designs are also possible.

The receiving member 413 and inner member 415 are then secured to the base frame independently or to one another and then to the frame as a unit, using a variety of methods as known to those skilled in the art.

It should be noted that when desired, it is possible to have embodiments where the top hat can only be partially removed. In such an example, the receiving portion and the inner portion may be only secured to the frame independently such that only the receiving portion is removed selectively. In certain instances, removing the receiving member may be sufficient to cause adequate and desired height/weight reduction to enable easier installation and/or transport of the unit. However, once final installation is performed, it may be desirable to have the receiving member to ensure structural and electrical integrity.

The concept of having an easy to assemble and disassemble top hat promotes the reduction in weight of currently the heaviest element in the breakdown process which is the top hat itself. Referring back to FIG. 3, it is possible to use the top hat design with the frame 400 in a way such that by providing this option the number of personnel that requires the installation of the frame is reduced to a minimum. In this case, it is even possible to limit the number of Customer Engineers (CE) operation to one person, thereby saving costs. This is because in smaller units, a removable top hat allows the reduction of all single element weights below 39.6 lbs or so which is easily manageable by one person.

Referring back to FIG. 3, in a different arrangement when the frame and/or servers are larger and resemble that of frame 312 and 314, the top hat design as provided by the embodiment of FIG. 4 allows the bulk power enclosure(s) (hereinafter BPE) to remain fastened to the top-hat, thereby shortening disassembly/re-assembly time. In this case, again even though the number of CEs required to carryout the process may be more than one person, but it is nonetheless kept to a minimum. It is for example possible to only have (2) CEs carrying the procedure. This is because many of the requirements that were procedural necessities in the breakdown process employed by the prior art can be suspended. For example, if a traditional breakdown process is to be employed, only the removal of A-frame Internal Battery Feature(s) (IBF) or possibly the removal of backup cooling Air Moving Assembly (AMA) may be necessary. In doing so, the breakup of many larger servers can be reduced to a single CE operation.

The following table provides some examples of this reduction of process steps. In Table 1, some examples of the weight of conventional units are provided. In addition, one example of the approximate weight of some of the embodiments of the present invention is also provided. As can be seen by providing a split top hat design the weight is significantly reduced.

TABLE 1

Top hat attributes:

| Design attribute | Conventional Hats | Split Top Hat such as proposed by embodiment of FIG. 4 |
|---|---|---|
| Top Hat Weight | 70 lbs (unpopulated) | 38 lbs |
| Other components such as BPE weight | 30 lbs | 30 lbs |
| Weight of Top Hat plus BPE | 130 lbs or more (single fields replaceable unit or FRU not possible) | 70 lbs |

In FIG. 5, an alternate embodiment is provided illustrating a collapsible top hat referenced as 500. In this embodiment, the frame's height reduction is supported by employing a plurality of self-contained, collapsible side members referenced as 510. The embodiment of FIG. 5 provides for an illustration of the collapsible option. Moving from the left hand side to the right, a progression of illustrations can be observed showing the feature in its full height and collapsing it until it is almost flush with the height of the frame 550.

A variety of different embodiments can be employed that allows for the collapsibility feature of the present invention as suggested by illustration of FIG. 5. In the embodiment, as shown in FIG. 5, a top member or an "upper portion" 520 of top hat 500 is connected to a plurality of collapsible side members 510 that are pivotable and can collapse upon themselves to extend (or retract) the top member. The side members extend between the top member 520 and base frame 550. The top hat 500 as shown in this is used for housing electronic components. The base frame 550 has a height 502 and a length 504 and the collapsible top hat 500 is connected to an upper portion 552 of the frame. The top member 520 of the top hat has a length 506 extending in a direction of the length 504 of base frame 550 and the side members 510 have lengths 508 extending in the direction of length of the base frame 550. The top member 520 and the side members 510 collectively provide surfaces of the top hat on which to mount at least a bulk power enclosure. Each the side member is pivotable from an upright first position supporting the top member above the base frame to a lowered second position in which the top member is adjacent the base frame. In this way, the side members can extend or retract the top member from a first position to a second position.

In the illustrated figure, the frame contents are removed from and a preferred embodiment is shown that allows a lever or screw actuated approach to be used to drive the pivoted side members to collapse onto themselves, thereby lowering/increasing the frames top height and/or moving the upper portion of the collapsible feature or collapsible member from a first to a second position (top to base). As shown, in an embodiment of the present invention, the top hat 500 has collapsible pivot points at the top member 520 of the top hat 500. In a further embodiment the side members remain substantially rigid and unbent while extending or retracting. A variety of other options are also available and the designs of the sides may be selectively designed. For example, in one design, the sides may be secured to the bottom of the upper portion and have a criss-cross collapsible design, while in other alternate embodiments they may be secured to the sides of the upper portion and have additional extending members to aid them in extending and collapsing action.

In addition, the collapsible top hat may be secured to the frame in a number of manners known to those skilled in the art. The same is true about the securing of the sides to the upper portion 520. Since a variety of designs may be possible, a variety of securing option for the securing of the sides are also therefore possible.

As before, the collapsible top hat design provided in conjunction with FIG. 5 can be utilized with a variety of base frames, including but not limited to those discussed in conjunction with FIGS. 2 and 3, previously.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer assembly for housing electronic components, comprising:
   a base frame having a height and a length;
   a collapsible top hat connected to an upper portion of said base frame, said top hat having a top member having a length extending in a direction of said length of base frame and a plurality of side members extending between said base frame and said top member, said side members having lengths extending in the direction of length of said base frame, wherein said upper portion and side members collectively provide surfaces of said top hat on which to mount at least a bulk power enclosure, each said side member being pivotable from an upright first position supporting said top member above said base frame to a lowered second position in which said top member is adjacent said base frame so that said side members can extend or retract the upper portion from a first to a second position, wherein said side members remain substantially unbent while extending and retracting from said first position to said second position and said side members are pivotable from said top member.

2. The assembly of claim 1 wherein said side members also incorporate a lever to be used to drive the pivoted side members to collapse onto themselves.

3. The assembly of claim 1 wherein said side members also incorporate a screw actuated member to be used to drive the pivoted side members to collapse onto themselves.

4. The assembly of claim 1, wherein said side members are secured to the bottom said top hat.

5. The assembly of claim 1, wherein said side members criss-cross one another.

6. The assembly of claim 1, wherein said side members are secured to the sides of said top member.

7. The assembly of claim 1, wherein said side members have additional sub-members that allows them to extend and then collapse such that said top member becomes flush with said top of said base frame. one another.

8. A method of increasing and decreasing the height of a computer frame housing electronic components, comprising the steps:

securing a collapsible top hat to an upper portion of a base frame such that said collapsible top hat can extend from a first open position to a second closed position; said top hat having a top member having a length extending in a direction of a length of base frame and a plurality of side members having heights extending between said base frame and said top member in a direction of a height of said base frame, said side members having lengths extending in the direction of the length of said base frame, wherein said top member and said side members collectively provide surfaces of said top hat on which to mount at least a bulk power enclosure, each said side member being pivotable from an upright first position supporting said top member above said base frame, to a lowered second position in which said top member is adjacent said base frame so as to extend and retract said top member between said first position and said second position, wherein said side members remain substantially rigid while extending or retracting from said first position to said second position and said side members are pivotable from said top member.

9. The method of claim 8, wherein said step of extending includes manipulating a lever to drive said side members to collapse onto themselves.

10. The method of claim 8, wherein said side members also incorporate a screw actuated member to be used to drive the pivoted side members to collapse.

* * * * *